(12) United States Patent
Eom et al.

(10) Patent No.: US 11,462,511 B2
(45) Date of Patent: Oct. 4, 2022

(54) SEMICONDUCTOR PACKAGE INCLUDING STACKED SEMICONDUCTOR CHIPS

(71) Applicant: SK hynix Inc., Icheon-si Gyeonggi-do (KR)

(72) Inventors: Ju Il Eom, Icheon-si Gyeonggi-do (KR); Jin Kyoung Park, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 199 days.

(21) Appl. No.: 17/070,174

(22) Filed: Oct. 14, 2020

(65) Prior Publication Data

US 2022/0013499 A1  Jan. 13, 2022

(30) Foreign Application Priority Data

Jul. 9, 2020 (KR) .................... 10-2020-0084680

(51) Int. Cl.
*H01L 25/065* (2006.01)

(52) U.S. Cl.
CPC .. *H01L 25/0657* (2013.01); *H01L 2225/0651* (2013.01); *H01L 2225/06562* (2013.01); *H01L 2225/06586* (2013.01)

(58) Field of Classification Search
CPC .................. H01L 25/0657; H01L 2225/06562
See application file for complete search history.

(56) References Cited

U.S. PATENT DOCUMENTS

| 2015/0262877 A1* | 9/2015 | Kurita ..................... H01L 24/17 257/737 |
| 2020/0272564 A1* | 8/2020 | Keeth ................. G06F 12/0653 |
| 2021/0125882 A1* | 4/2021 | Oh ......................... H01L 21/565 |
| 2021/0183843 A1* | 6/2021 | Arifeen ................... H01L 23/13 |

FOREIGN PATENT DOCUMENTS

| KR | 1020180052351 A | 5/2018 |
| KR | 1020190062178 A | 6/2019 |
| KR | 102019352 B1 | 9/2019 |

* cited by examiner

*Primary Examiner* — Yu-Hsi D Sun
(74) *Attorney, Agent, or Firm* — William Park & Associates Ltd.

(57) ABSTRACT

A semiconductor package includes a sub semiconductor package disposed over a substrate. The sub semiconductor package includes a sub semiconductor chip with chip pads on its upper surface, a sub molding layer that surrounds the sub semiconductor chip, and a redistribution conductive layer that is connected to each of the chip pads and extends over an upper surface of the sub molding layer. The redistribution conductive layer includes a signal redistribution conductive layer that extends onto an edge of the sub molding layer and has a signal redistribution pad on its end portion and a power redistribution conductive layer with a length that is shorter than a length of the signal redistribution conductive layer. The semiconductor package also includes a sub signal interconnector, sub power interconnector, and at least one main semiconductor chip formed over the sub semiconductor package and electrically connected to the substrate or the sub semiconductor chip.

14 Claims, 13 Drawing Sheets

SEMICONDUCTOR PACKAGE INCLUDING STACKED SEMICONDUCTOR CHIPS

CROSS-REFERENCE TO RELATED APPLICATION

This application claims priority under 35 U.S.C. § 119 to Korean Patent Application No. 10-2020-0084680 filed on Jul. 9, 2020, which is incorporated herein by reference in its entirety.

BACKGROUND

1. Technical Field

This patent document relates to a semiconductor package, and more particularly, to a semiconductor package in which a plurality of semiconductor chips are stacked in a vertical direction.

2. Related Art

Electronic products require high-volume data processing, even as the sizes of the electronic products become smaller. Accordingly, there is a growing need to increase the degree of integration of semiconductor devices that are used in such electronic products.

However, due to the limitations of semiconductor integration technology, it is difficult to satisfy a required function with only a single semiconductor chip, and thus, a semiconductor package in which a plurality of semiconductor chips are embedded therein has been manufactured.

SUMMARY

In an embodiment, a semiconductor package may include: a substrate; a sub semiconductor package disposed over the substrate, wherein the sub semiconductor package includes a sub semiconductor chip with chip pads on its upper surface, a sub molding layer that surrounds side surfaces of the sub semiconductor chip, and a redistribution conductive layer that is connected to each of the chip pads and extends over an upper surface of the sub molding layer, wherein the redistribution conductive layer includes a signal redistribution conductive layer that extends onto an edge of the sub molding layer with a signal redistribution pad on its end portion and includes a power redistribution conductive layer with a length that is shorter than a length of the signal redistribution conductive layer; a sub signal interconnector connecting the signal redistribution pad to the substrate; a sub power interconnector extending in a vertical direction under the power redistribution conductive layer to connect the power redistribution conductive layer and to the substrate; and at least one main semiconductor chip formed over the sub semiconductor package and electrically connected to the substrate or the sub semiconductor chip.

In another embodiment, a semiconductor package may include: a substrate; a sub semiconductor package disposed over the substrate, wherein the sub semiconductor package includes a sub semiconductor chip with chip pads on its upper surface, a sub molding layer that surrounds side surfaces of the sub semiconductor chip, and a redistribution conductive layer that is connected to each of the chip pads and extends onto an edge of the sub molding layer, wherein the redistribution conductive layer includes a signal redistribution conductive layer that has a signal redistribution pad on its end portion, and a power redistribution conductive layer with a power redistribution pad on its end portion; a sub signal interconnector connecting the signal redistribution pad to the substrate; a sub power interconnector extending in a vertical direction under a portion of the power redistribution conductive layer to connect the power redistribution conductive layer to the substrate, the portion of the power redistribution conductive layer located between the power redistribution pad and the sub semiconductor chip; and at least one main semiconductor chip formed over the sub semiconductor package and electrically connected to the substrate or the sub semiconductor chip.

DETAILED DESCRIPTION

Figure 1:
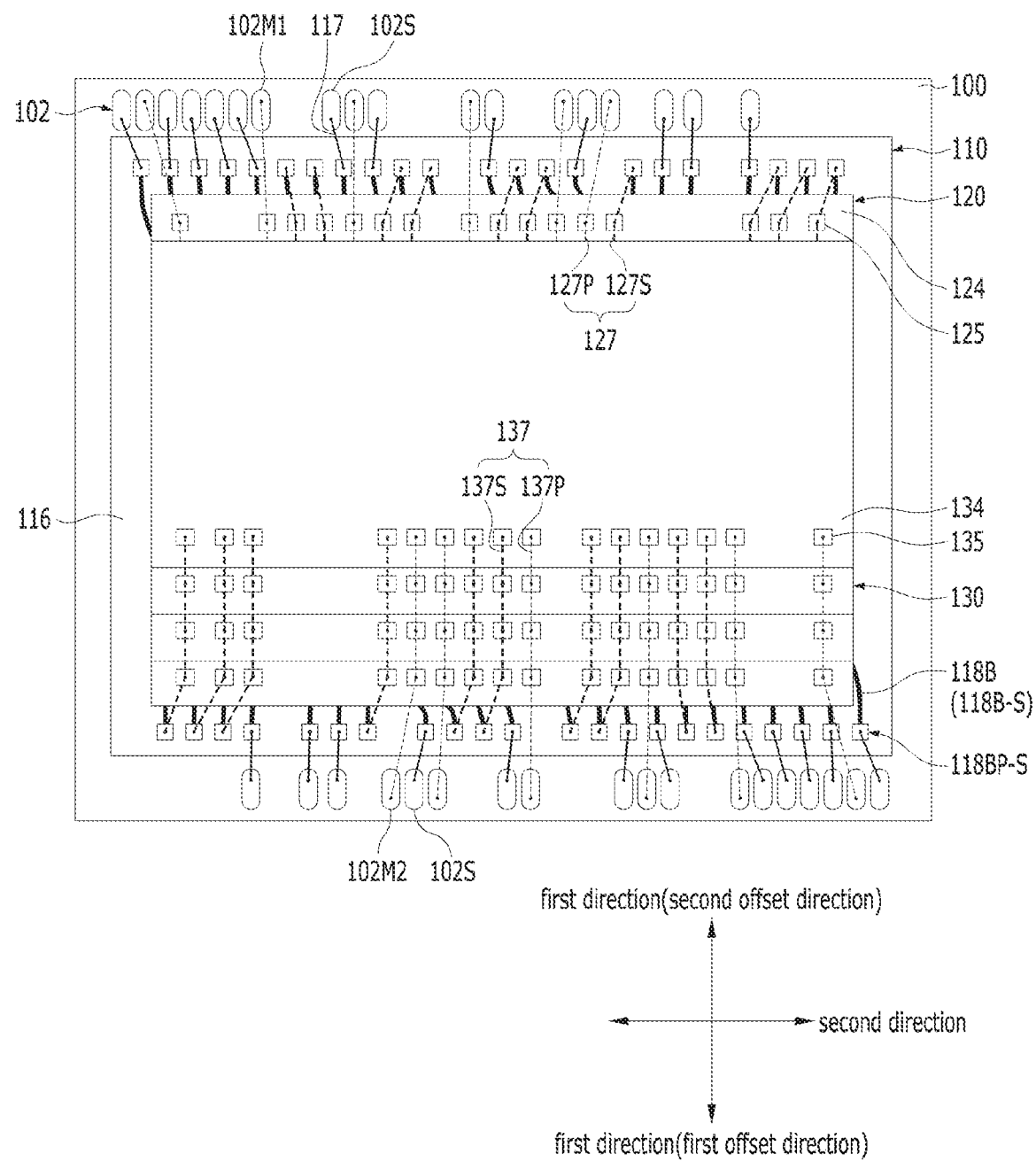
FIG. 1 is a planar view, illustrating a semiconductor package in accordance with an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description with two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

Figure 2:
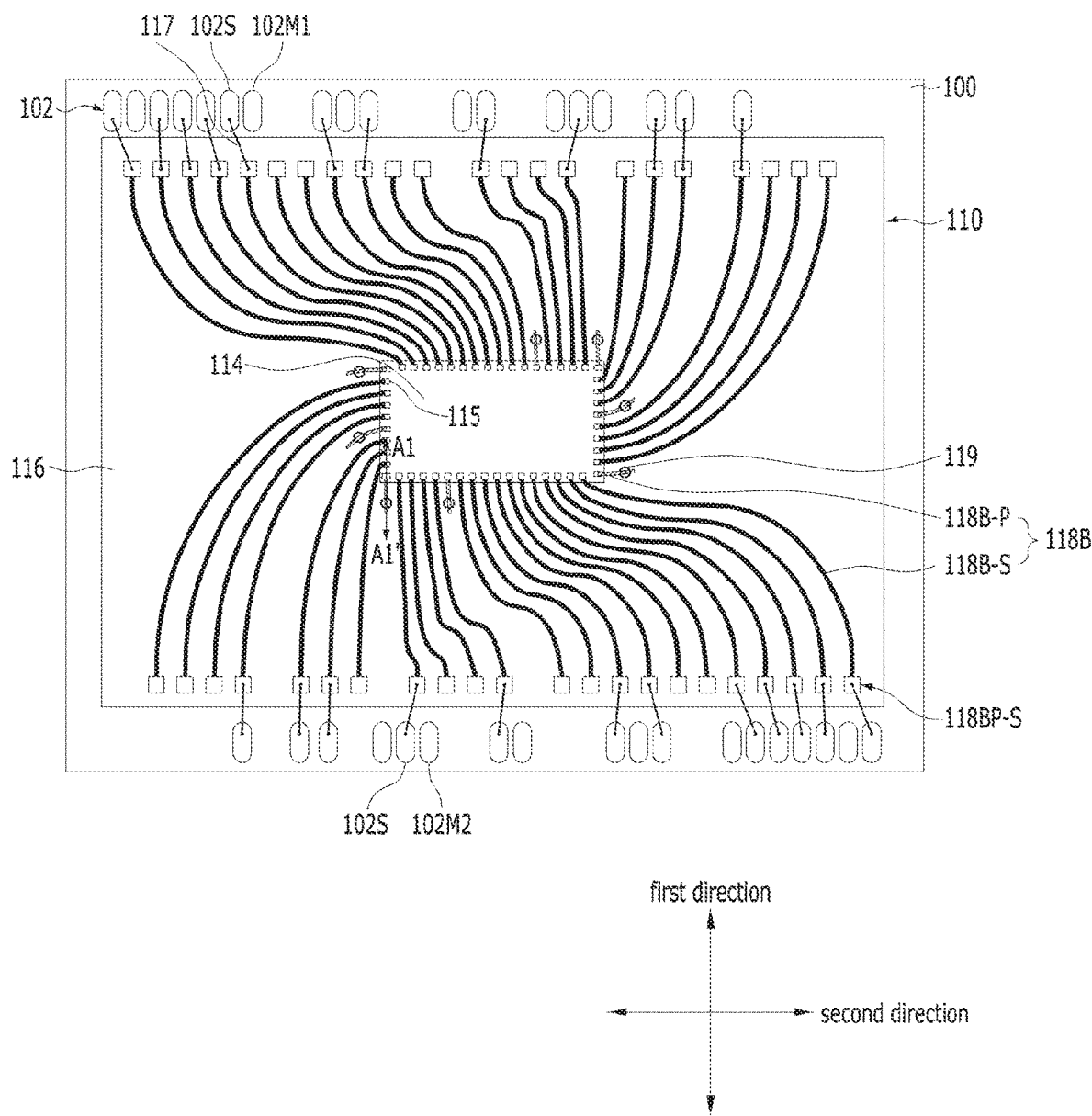
FIG. 2 is a planar view, illustrating a part of the semiconductor package, illustrated in FIG. 1, with a first main chip stack, a second main chip stack, and interconnectors that are connected with the first and second main chip stacks omitted.
Figure 3:
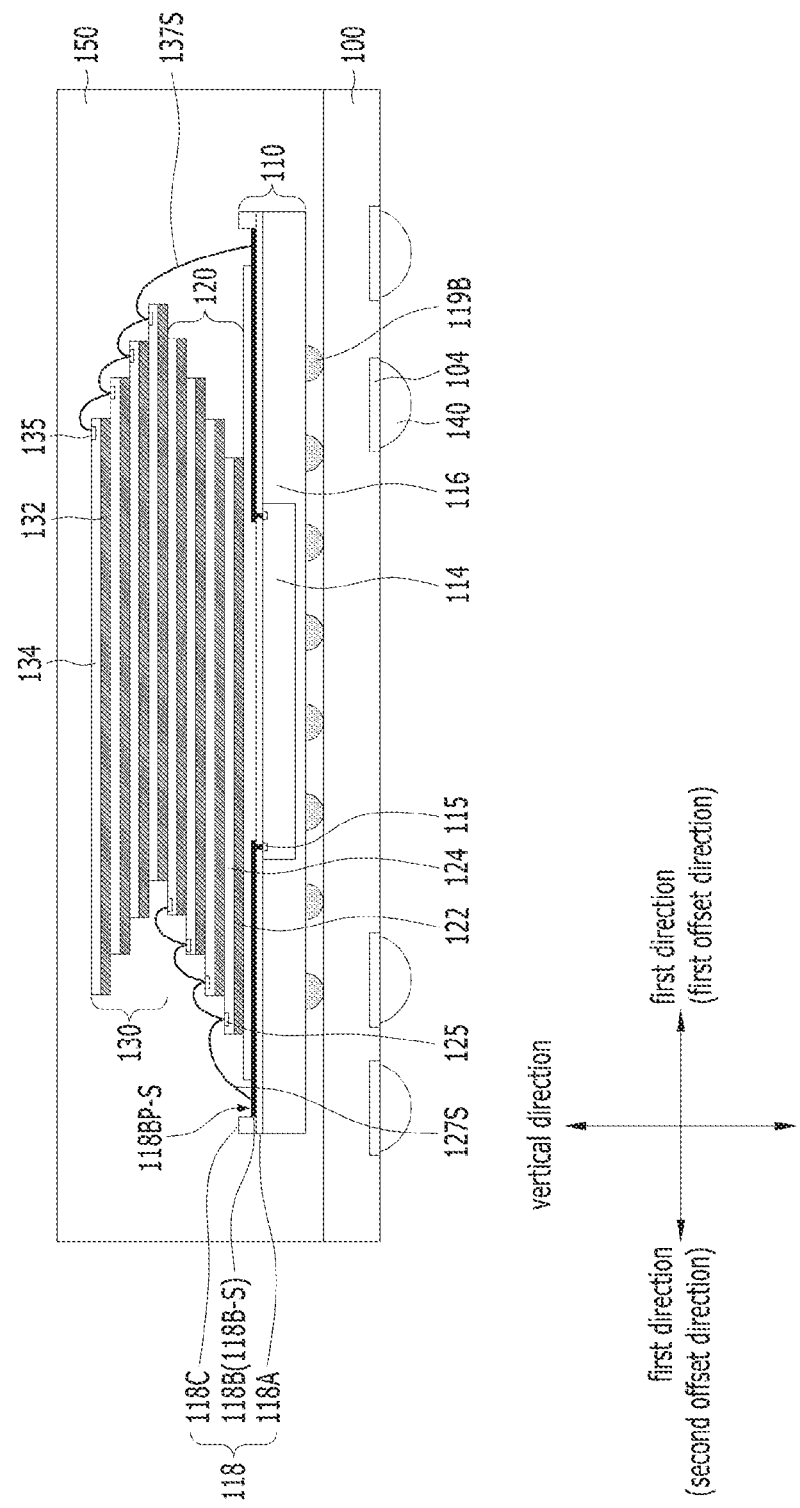
FIGS. 3 to 5 are cross-sectional views, illustrating the semiconductor package of FIG. 1.
Figure 4:
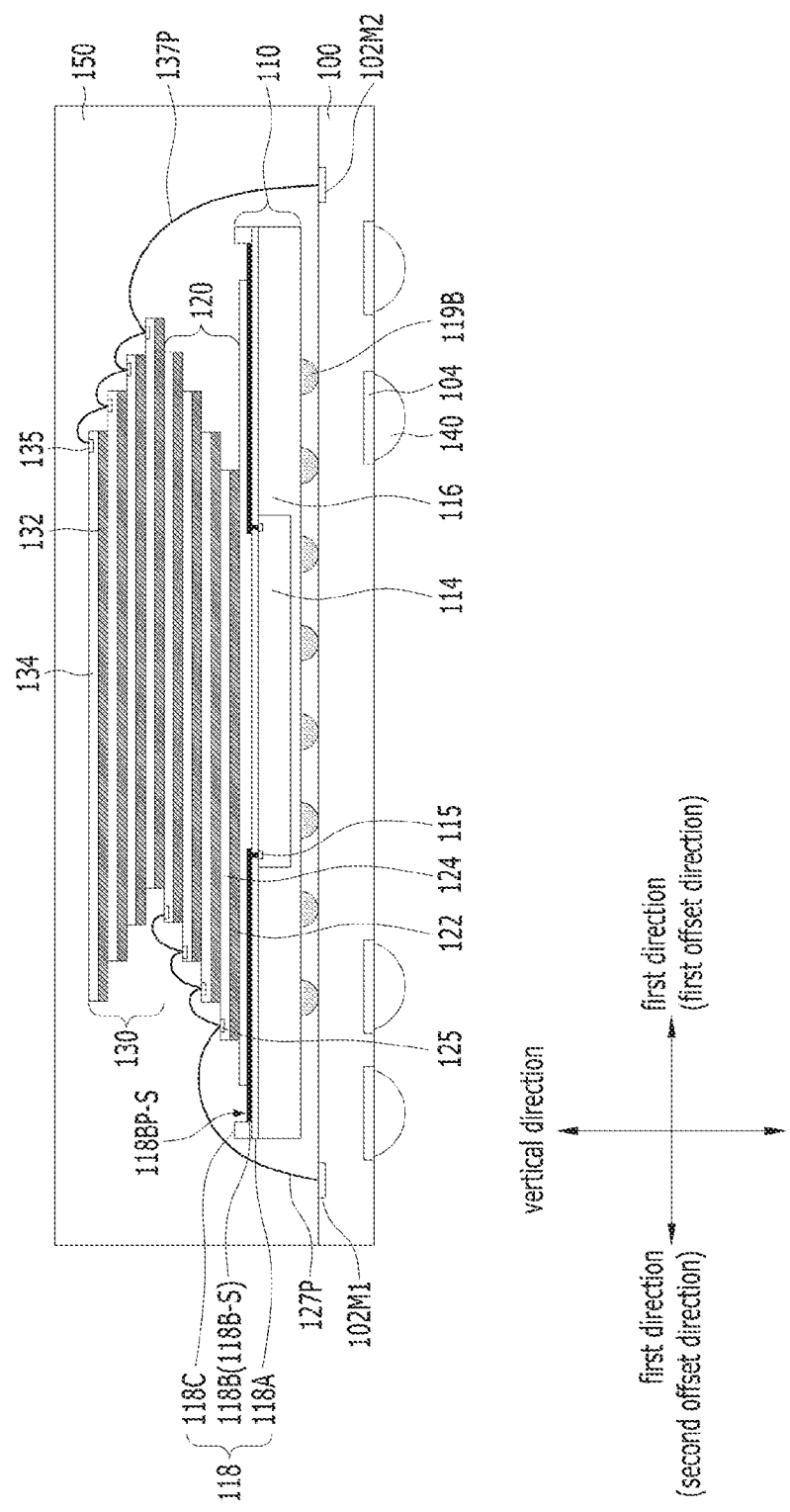
Figure 5:
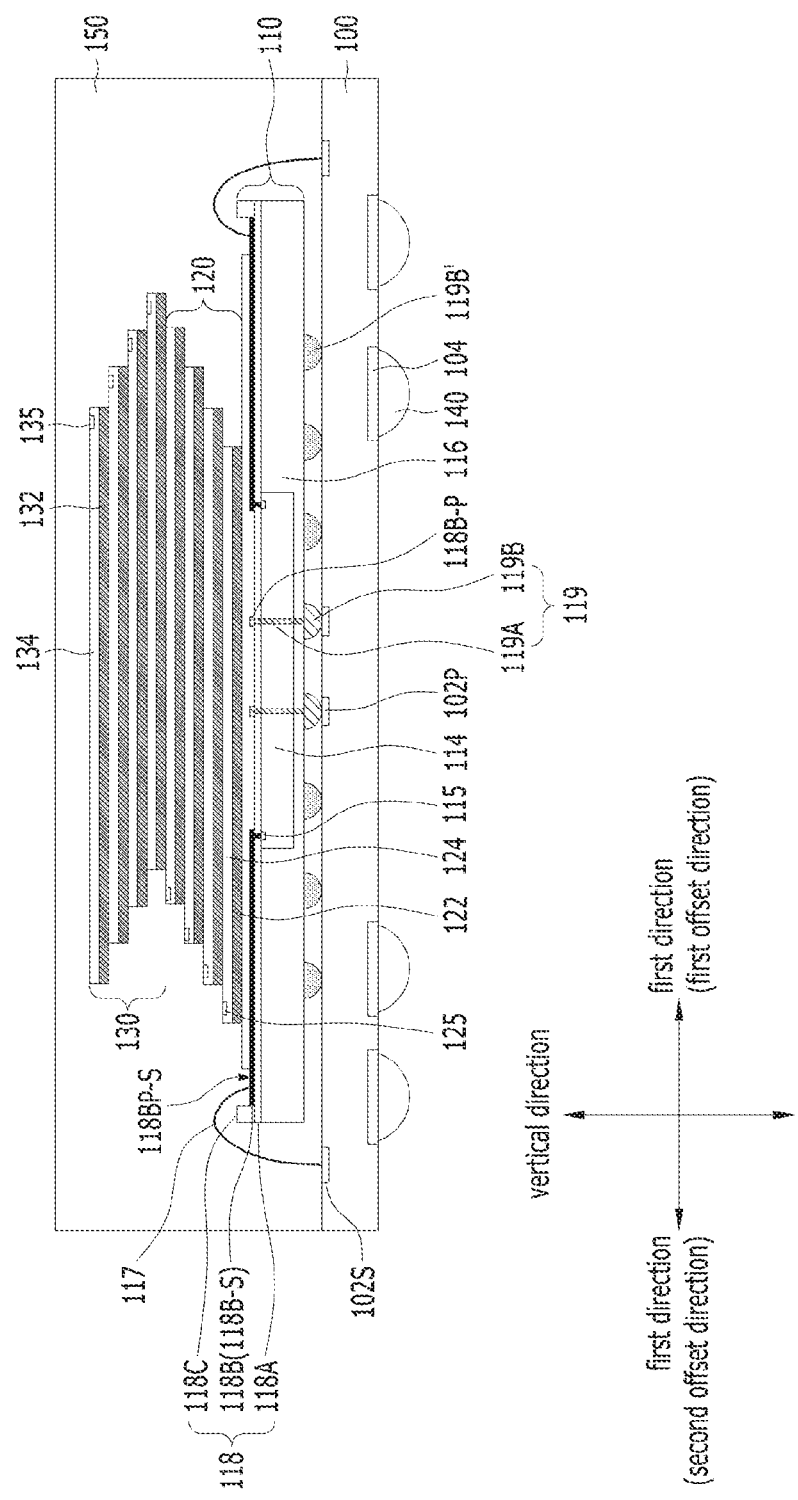

FIG. 1 is a planar view, illustrating a semiconductor package in accordance with an embodiment of the present disclosure. FIG. 2 is a planar view, illustrating a part of the semiconductor package, illustrated in FIG. 1, with a first main chip stack, a second main chip stack, and interconnectors that are connected with the first and second main chip stacks omitted. FIGS. 3 to 5 are cross-sectional views, illustrating the semiconductor package of FIG. 1. FIGS. 1 and 2 are top views of the semiconductor package and the part thereof, respectively. FIG. 3 mainly illustrates first and second main signal interconnectors of FIG. 1. FIG. 4 mainly illustrates first and second main power interconnectors of FIG. 1. FIG. 5 mainly illustrates a sub signal interconnector and a sub power interconnector of FIG. 1.

Referring to FIGS. 1 to 5, the semiconductor package may include a substrate 100, a sub semiconductor package 110 that is disposed over the substrate 100, and first and second main chip stacks 120 and 130 that are disposed over the sub semiconductor package 110.

The substrate 100 may be a substrate for a semiconductor package, which has a circuit and/or wiring structure to transfer electrical signals, such as a printed circuit board (PCB).

The substrate 100 may have an upper surface, a lower surface that is located on the opposite side of the upper surface, and side surfaces connecting the upper surface and the lower surface. The sub semiconductor package 110, the first main chip stack 120, and the second main chip stack 130 may be disposed over the upper surface of the substrate 100. External connection terminals 140 that connect the semiconductor package to external devices may be disposed over the lower surface of the substrate 100. For reference, an upper surface and a lower surface that will be described below are expressions to indicate relative positions of various surfaces of a component and do not indicate absolute positions. For example, in the case where the semiconductor package of the illustration is turned upside down, a surface over which the sub semiconductor package 110 and the first and second main chip stacks 120 and 130 are disposed may be a lower surface of the substrate 100 and a surface over which the external connection terminals 140 are disposed may be an upper surface of the substrate 100.

The substrate 100 may include upper surface substrate pads 102 and lower surface substrate pads 104. The upper surface substrate pads 102 may be disposed on the upper surface of the substrate 100 to electrically connect the sub semiconductor package 110, the first main chip stack 120, and the second main chip stack 130 to the substrate 100. The lower surface substrate pads 104 may be disposed on the lower surface of the substrate 100 to electrically connect the external connection terminals 140 to the substrate 100. For reference, substrate pads may mean electrically conductive elements or terminals that are exposed on the surfaces of the substrate 100 to electrically connect the substrate 100 to other components. As an example, the upper surface substrate pads 102 may be bond fingers for wire bonding, and the lower surface substrate pads 104 may be ball lands for bonding with solder balls. The upper surface substrate pads 102 and the lower surface substrate pads 104 may be connected with a circuit and/or wiring structure inside the substrate 100.

The upper surface substrate pads 102 may include a sub signal upper surface substrate pad 102S, a sub power upper surface substrate pad 102P, a first main upper surface substrate pad 102M1, and a second main upper surface substrate pad 102M2. For reference, because the sub power upper surface substrate pad 102P is shown only in FIG. 5, it will be described in more detail later. Besides the sub power upper surface substrate pad 102P, the upper surface substrate pads 102 may be disposed at both side edges of the substrate 100, which do not overlap with the sub semiconductor package 110. For example, the upper surface substrate pads 102 may be disposed at both side edges of the substrate 100 in a first direction. For reference, a first side of both sides in the first direction may correspond to an upper side of FIGS. 1 and 2, and a left side of FIGS. 3 to 5. Also, a second side of the both sides in the first direction may correspond to a lower side of FIGS. 1 and 2, and a right side of FIGS. 3 to 5. The sub signal upper surface substrate pad 102S may be disposed at each of the both side edges of the substrate 100 in the first direction and may be electrically connected to the sub semiconductor package 110. The first main upper surface substrate pad 102M1 may be disposed at the first side edge of the substrate 100 in the first direction, and may be electrically connected to the first main chip stack 120. The second main upper surface substrate pad 102M2 may be disposed at the second side edge of the substrate 100 in the first direction and may be electrically connected to the second main chip stack 130. At the first side edge of the substrate 100 in the first direction, one or more sub signal upper surface substrate pads 102S and one or more first main upper surface substrate pads 102M1 may be disposed in a required number at a required position and may be arranged to be spaced apart from each other in the second direction. At the second side edge of the substrate 100 in the first direction, one or more sub signal upper surface substrate pads 102S and one or more second main upper surface substrate pads 102M2 may be disposed in a required number at a required position and may be arranged to be spaced apart from each other in the second direction.

The sub semiconductor package 110 may have a planar area that is smaller than the upper surface of the substrate 100. The sub semiconductor package 110 may be disposed to expose at least the both side edges of the substrate 100 in the first direction and/or the upper surface substrate pads 102. As an example, the sub semiconductor package 110 may be disposed at a center region of the substrate 100. The sub semiconductor package 110 may be attached to the upper surface of the substrate 100 with an insulating adhesive material (not shown), such as a die attach film (DAF).

The sub semiconductor package 110 may include a sub semiconductor chip 114, a sub molding layer 116 that surrounds the lower and side surfaces of the sub semiconductor chip 114, and a redistribution structure 118 that is formed over the upper surfaces of the sub semiconductor chip 114 and the sub molding layer 116. For reference, in the planar views of FIGS. 1 and 2, redistribution insulating layers 118A and 118C of the redistribution structure 118 are omitted for convenience of description.

The sub semiconductor chip 114 may be a semiconductor chip that performs various functions that are required for operations of the first main chip stack 120 and/or the second main chip stack 130. In the present embodiment, the first and second main chip stacks 120 and 130 may include nonvolatile memory, such as NAND flash memory. In this case, the sub semiconductor chip 114 may include a memory controller to control the operations of the first and second main chip stacks 120 and 130. However, the present embodiment is not limited thereto, and the sub semiconductor chip 114 may include volatile memory, such as dynamic random access memory (DRAM) and static RAM (SRAM), non-volatile memory, such as NAND flash, resistive RAM (RRAM), phase-change RAM (PRAM), magneto-resistive RAM (MRAM) and ferroelectric RAM (FRAM), or other various active elements or passive elements.

The sub semiconductor chip 114 may have a lower surface that faces the upper surface of the substrate 100, an upper surface that is located on the opposite side of the lower surface, and side surfaces that connect the upper surface to the lower surface. In the present embodiment, the sub semiconductor chip 114 may have four side surfaces. The four side surfaces may be positioned at both sides in the first direction and at both sides in the second direction, respectively. For reference, a first side of the both sides in the second direction may correspond to a right side of FIGS. 1 and 2, and a second side of the both sides in the second direction may correspond to a left side of FIGS. 1 and 2.

The sub semiconductor chip 114 may be positioned at a center region of the sub semiconductor package 110. This is to make the lengths of signal redistribution conductive layers 118B-S, which will be described later, as similar to each other as possible.

A plurality of sub chip pads 115 may be disposed on the upper surface of the sub semiconductor chip 114. The sub semiconductor chip 114 may have a relatively small planar area, whereas the number of the sub chip pads 115 may be relatively large. When the first and second main chip stacks 120 and 130 include memories and the sub semiconductor chip 114 includes a memory controller, the size of the sub semiconductor chip 114 may decrease with the development of technology. On the other hand, a large number of the sub chip pads 115 that correspond to a large number of input/output signals may be required to connect the respective first and second main chip stacks 120 and 130 and the sub semiconductor chip 114 through independent channels. To satisfy this requirement, the sub chip pads 115 may be arranged along the edges of all sides of the sub semiconductor chip 114. That is to say, the sub chip pads 115 may be arranged along the first and second side edges of the sub semiconductor chip 114 in the first direction, and along third and fourth side edges of the sub semiconductor chip 114 in the second direction.

The sub molding layer 116 may have an upper surface with substantially the same height as the upper surface of the sub semiconductor chip 114 while surrounding the side surfaces of the sub semiconductor chip 114. Therefore, the sub molding layer 116 may expose the upper surface of the sub semiconductor chip 114 and the sub chip pads 115. In the present embodiment, the sub molding layer 116 may cover the lower surface of the sub semiconductor chip 114. However, the present embodiment is not limited thereto. In another embodiment, the sub molding layer 116 may have a lower surface with substantially the same height as the lower surface of the sub semiconductor chip 114. The sub molding layer 116 may include various molding materials, such as an epoxy molding compound (EMC).

The redistribution structure 118 may extend onto the upper surface of the sub molding layer 116 while being electrically connected to the sub chip pads 115. In other words, the sub semiconductor package 110, according to the present embodiment, may be a fan-out package.

The redistribution structure 118 may include a first redistribution insulating layer 118A, redistribution conductive layers 118B, and a second redistribution insulating layer 118C. The first redistribution insulating layer 118A may cover the upper surfaces of the sub semiconductor chip 114 and the sub molding layer 116. The first redistribution insulating layer 118A may have openings that expose the sub chip pads 115 and a sub power interconnector 119, which will be described later. The redistribution conductive layers 118B may be formed over the first redistribution insulating layer 118A. The redistribution conductive layers 118B may be electrically connected to the sub chip pads 115 and the sub power interconnector 119 through the openings of the first redistribution insulating layer 118A. The redistribution conductive layers 118B may include a signal redistribution layer 118B-S and a power redistribution layer 118B-P, which will be described later. The second redistribution insulating layer 118C may cover the first redistribution insulating layer 118A and the redistribution conductive layers 118B. The second redistribution insulating layer 118C may cover the first redistribution insulating layer 118A and the redistribution conductive layers 118B, while having an opening that exposes a portion of the signal redistribution conductive layer 118B-S. The first redistribution insulating layer 118A and the second redistribution insulating layer 118C may include an insulating material such as oxide, nitride, or oxynitride. Alternatively, the first redistribution insulating layer 118A and the second redistribution insulating layer 118C may include a resin material, such as epoxy, polyimide, polybenzoxazole (PBO), benzocyclobuten (BCB), silicone, or acrylate. The redistribution conductive layers 118B may include a metal material such as gold, copper, or a copper alloy.

The signal redistribution conductive layer 118B-S may be for signal transmission between the sub semiconductor chip 114 and other components. As an example, the signal redistribution conductive layer 118B-S may be for a signal exchange between the sub semiconductor chip 114 and the first main chip stack 120, between the sub semiconductor chip 114 and the second main chip stack 130, or between the sub semiconductor chip 114 and the substrate 100.

A plurality of signal redistribution conductive layers 118B-S may extend toward both side edges of the sub molding layer 116 in the first direction. For reference, a first side edge of the side edges of the sub molding layer 116 in the first direction may face the first side edge of the substrate 100, and a second side edge of the side edges of the sub molding layer 116 in the first direction may face the second side edge of the substrate 100. As an example, the signal redistribution conductive layers 118B-S, which are connected to the sub chip pads 115 that are disposed at the first and third side edges of the sub semiconductor chip 114 in the first and second directions, respectively, may extend to the first side edge of the sub molding layer 116 in the first direction. Furthermore, the signal redistribution conductive layers 118B-S, which are connected to the sub chip pads 115 disposed at the second and fourth side edges of the sub semiconductor chip 114 in the first and second directions, respectively, may extend to the second side edge of the sub molding layer 116 in the first direction. The signal redistribution conductive layers 118B-S, which extend from both side edges of the sub semiconductor chip 114 in the second direction, may have curved shapes toward both side edges of the sub molding layer 116 in the first direction. Meanwhile, the signal redistribution conductive layers 118B-S, which extend from both side edges of the sub semiconductor chip 114 in the first direction, might not have to be bent. However, in order to have lengths that are similar to the lengths of the signal redistribution conductive layers 118B-S that extend from the both side edges of the sub semiconductor chip 114 in the second direction, the signal redistribution conductive layers 118B-S that extend from the both side edges of the sub semiconductor chip 114 in the first direction may also have curved shapes. As a result, the signal redistribution conductive layers 118B-S may have a spiral shape, centering around the sub semiconductor chip 114. Through such a connection scheme, it may be possible to reduce the variations in the lengths of the signal redistribution conductive layers 118B-S.

Based on the arrangement of the signal redistribution conductive layers 118B-S, the end portions of the signal redistribution conductive layers 118B-S may be arranged along the second direction, at each of the edges of the sub molding layer 116 in the first direction. The second redistribution insulating layer 118C may have openings that expose the end portions of the signal redistribution conductive layers 118B-S. The portions of the signal redistribution conductive layers 118B-S, which are exposed by the openings of the second redistribution insulating layer 118C, will be hereinafter referred to as signal redistribution pads 118BP-S. The signal redistribution conductive layers 118B-S may extend from the sub chip pads 115, and each signal redistribution conductive layer 118B-S may have a line-shaped portion with a relatively small width and a plate-shaped end with a relatively large width while being positioned at an end of the line-shaped portion. The opening of the second redistribution insulating layer 118C may expose the plate-shaped end of the signal redistribution conductive layer 118B-S and may have a planar area that is less than or equal to a planar area of the plate-shaped end while overlapping the plate-shaped end. The signal redistribution pads 118BP-S may be disposed at both side edges of the sub molding layer 116 in the first direction. Furthermore, the signal redistribution pads 118BP-S may be arranged along the second direction at each of the side edges of the sub molding layer 116 in the first direction.

The signal redistribution pad 118BP-S may be electrically connected to the substrate 100, the first main chip stack 120, or the second main chip stack 130. In particular, the signal redistribution pad 118BP-S that is electrically connected to the substrate 100 may be electrically connected to the sub signal upper surface substrate pad 102S through a sub signal interconnector 117. One end of the sub signal interconnector 117 may be connected to the signal redistribution pad 118BP-S, and the other end of the sub signal interconnector 117 may be connected to the sub signal upper surface substrate pad 102S. The sub signal upper surface substrate pad 102S at the first side edge of the substrate 100 may be connected to the signal redistribution pad 118BP-S at the first side edge of the sub molding layer 116. The sub signal upper surface substrate pad 102S at the second side edge of the substrate 100 may be connected to the signal redistribution pad 118BP-S at the second side edge of the sub molding layer 116. A bonding wire may be used as the sub signal interconnector 117. However, the present embodiment is not limited thereto, and various types of electrical interconnectors may be used as the sub signal interconnector 117. The connection between the first main chip stack 120 and the signal redistribution pad 118BP-S, or between the second main chip stack 130 and the signal redistribution pad 118BP-S will be described later.

The power redistribution conductive layer 118B-P may be for supplying power from the substrate 100 to the sub semiconductor chip 114. Power voltages of various levels or a ground voltage may be supplied to the sub semiconductor chip 114 through the power redistribution conductive layer 118B-P. For convenience of description, the power redistribution conductive layer 118B-P is not shown in the cross-sectional views of FIGS. 3 and 4, and is shown only in the cross sectional view of FIG. 5. In addition, in the planar view of FIG. 1, because the power redistribution conductive layer 118B-P is covered by the first and second main chip stacks 120 and 130, the power redistribution conductive layer 118B-P is not visible. Accordingly, the following description of the power redistribution conductive layer 118B-P, and the sub power interconnector 119 and the sub power upper surface substrate pad 102P to be connected thereto, will be described with reference to FIGS. 2 and 5. Further, FIG. 6, illustrating a cross-section that is taken along a line A1-A1' of FIG. 2 will be referred together with FIGS. 2 and 5.

Figure 6:
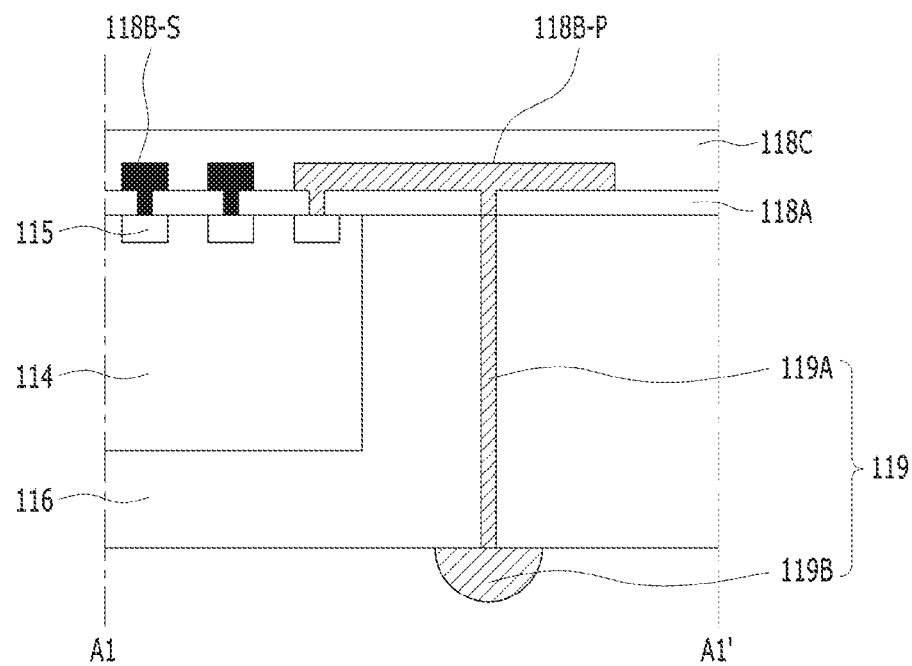
FIG. 6 is a cross-sectional view that is taken along a line A1-A1' of FIG. 2.

Referring to FIGS. 2, 5, and 6, the power redistribution conductive layer 118B-P may be connected to the sub chip pad 115 and may extend over the upper surface of the sub molding layer 116. The power redistribution conductive layer 118B-P may have a length that is shorter than the signal redistribution conductive layer 118B-S. That is, unlike the signal redistribution conductive layer 118B-S, the power redistribution conductive layer 118B-P might not extend to the edge of the sub molding layer 116. The power redistribution conductive layer 118B-P may be substantially parallel to a part of the adjacent signal redistribution conductive layer 118B-S. This may be to prevent an electrical short between the power redistribution conductive layer 118B-P and the signal redistribution conductive layer 118B-S.

The power redistribution conductive layer 118B-P may be electrically connected to the sub power upper surface substrate pad 102P of the substrate 100 with the sub power interconnector 119 that is disposed under the power redistribution conductive layer 118B-P. The sub power interconnector 119 may include a penetrating electrode 119A and a connection electrode 119B. The penetrating electrode 119A may penetrate the sub molding layer 116. An upper surface of the penetrating electrode 119A may be connected to the power redistribution conductive layer 118B-P, and a lower surface of the penetrating electrode 119A may be connected to the connection electrode 119B. For reference, in the cross-sectional view of FIG. 5, it seems that the penetrating electrode 119A penetrates the sub semiconductor chip 114. However, in actuality, FIG. 5 shows that the sub semiconductor chip 114 is behind the penetrating electrode 119A. As shown in the planar view of FIG. 2 and the cross-sectional view of FIG. 6, the penetrating electrode 119A may penetrate the sub molding layer 116 by being spaced apart from the sub semiconductor chip 114 by a predetermined distance. In a planar view, the penetrating electrode 119A may be positioned at any position as long as it overlaps and connects with a part of the power redistribution conductive layer 118B-P while being spaced apart from the sub semiconductor chip 114 by a predetermined distance. The connection electrode 119B may be disposed in a space between the sub molding layer 116 and the substrate 100. An upper surface of the connection electrode 119B may be connected to the penetrating electrode 119A, and a lower surface of the connection electrode 119B may be connected to the sub power upper surface substrate pad 102P. The penetrating electrode 119A may be a via with a relatively small width, and the connection electrode 119B may be a solder ball or a metal bump with a width that is greater than the penetrating electrode 119A. However, the present embodiment is not limited thereto, and various types of electrical interconnectors, which extend from the power redistribution conductive layer 118B-P to the sub power upper surface substrate pad 102P in a vertical direction, may be used as the sub power interconnector 119. Although not shown, an additional insulating layer may be disposed between the sub molding layer 116 and the connection electrode 119B. An opening may be formed in the additional insulating layer to expose the penetrating electrode 119A to be connected to the connection electrode 119B.

Meanwhile, the connection electrode 119B may be interposed in a space between the sub semiconductor package 110 and the substrate 100 to support the sub semiconductor package 110. The height of the connection electrode 119B may be substantially the same as the distance between the sub molding layer 116 and the substrate 100. The connection electrode 119B may be disposed to overlap each of the power redistribution conductive layers 118B-P. Accordingly, a plurality of connection electrodes 119B may be disposed at predetermined intervals along the periphery of the sub semiconductor chip 114, and thus, the connection electrode 119B may sufficiently support the sub semiconductor package 110. Further, a dummy connection electrode 119B', which is not connected to the penetrating electrode 119A, may be additionally disposed over the lower surface of the sub molding layer 116. The dummy connection electrode 119B' may prevent the sub semiconductor package 110 from being tilted in a direction or may withstand the pressure that is generated when mounting the first main chip stack 120 and the second main chip stack 130 over the sub semiconductor package 110.

Referring again to FIGS. 1 to 5, the first main chip stack 120 may include a plurality of first main semiconductor chips 124. The first main semiconductor chips 124 may be formed over the sub semiconductor package 110 and may be stacked in a vertical direction with respect to the upper surface of the substrate 100. While the present embodiment illustrates a case where the first main chip stack 120 includes four first main semiconductor chips 124, the present disclosure is not limited thereto, and the number of first main semiconductor chips 124 that are included in the first main chip stack 120 may be variously modified to one or more first main semiconductor chips 124.

Each of the first main semiconductor chips 124 may include NAND flash memory as described above. However, the present disclosure is not limited thereto, and each of the first main semiconductor chips 124 may include volatile memory, such as dynamic random access memory (DRAM) and static RAM (SRAM), or nonvolatile memory, such as resistive RAM (RRAM), phase-change RAM (PRAM), magneto-resistive RAM (MRAM), and ferroelectric RAM (FRAM).

The first main semiconductor chips 124 may be stacked with a predetermined offset in a direction toward the second side in the first direction. For example, the offset may be in a direction toward the lower side in FIG. 1 and the right side in FIGS. 3 to 5. Therefore, the first main chip stack 120 that has a step shape when viewed in its entirety may be formed. The offset stacking direction of the first main semiconductor chips 124 may be referred to as a first offset direction. Based on such offset stacking, a first side edge of an upper surface of each of the remaining first main semiconductor chips 124, except for the uppermost first main semiconductor chip 124 among the first main semiconductor chips 124, may be exposed without being covered by the first main semiconductor chip 124 lying immediately thereon. For example, the upper side edge of the upper surface of each of the remaining first main semiconductor chips 124 in FIG. 1 and the left side edge of the upper surface of each of the remaining first main semiconductor chips 124 in FIG. 3 may be exposed. A first side edge of an upper surface of the uppermost first main semiconductor chip 124 may be exposed without being covered by the lowermost second main semiconductor chip 134 of the second main chip stack 130, which will be described later. First chip pads 125 may be disposed on such exposed portions of the first main semiconductor chips 124. A plurality of first chip pads 125 may be arranged in a line in the second direction at the first side edge of the upper surface of each of the first main semiconductor chips 124. However, the present disclosure is not limited thereto, and the number and arrangement of the first chip pads 125 at the first side edge of the upper surface of each of the first main semiconductor chips 124 may be variously modified. For reference, because a part of the first main chip stack 120 that is hidden by the second main chip stack 130 is not illustrated in the planar view of FIG. 1, the remaining part of the first main chip stack 120, for example, a first side edge of the lowermost first main semiconductor chip 124, is illustrated.

Each of the first main semiconductor chips 124 may be attached to the sub semiconductor package 110 or the first main semiconductor chip 124, lying immediately thereunder, with a first adhesive layer 122. The first adhesive layer 122 may be formed on the lower surface of each of the first main semiconductor chips 124 to have a shape that overlaps with the lower surface.

The first main chip stack 120 or the first main semiconductor chips 124 may have a planar area that is smaller than the sub semiconductor package 110 and may have a planar area that is larger than the sub semiconductor chip 114. The first main chip stack 120 may be disposed to expose at least the signal redistribution pads 118BP-S that is disposed at the both side edges of the sub semiconductor package 110 in the first direction. A direct connection between the first main chip stack 120 and the sub semiconductor package 110, that is, a connection without passing through the substrate 100, may be possible when the signal redistribution pads 118BP-S are exposed.

The first main chip stack 120 may be connected to the substrate 100 and the sub semiconductor package 110 through first main interconnectors 127. In the present embodiment, the first main chip stack 120 may be electrically connected to the substrate 100 to receive power that is required for the operations of the first main chip stack 120 from the substrate 100. Also, the first main chip stack 120 may be electrically connected to the sub semiconductor package 110 to exchange signals with the sub semiconductor chip 114. An interconnector among the first main interconnectors 127, which connects the first main chip stack 120 and the substrate 100, will be referred to as a first main power interconnector 127P. Also, an interconnector among the first main interconnectors 127, which connects the first main chip stack 120 and the sub semiconductor package 110, will be referred to as a first main signal interconnector 127S.

In particular, referring to FIGS. 1 and 3, the first main signal interconnector 127S may connect the adjacent first chip pads 125 to each other in the vertical direction and may connect the first chip pad 125 of the lowermost first main semiconductor chip 124 to the signal redistribution pad 118BP-S that are disposed at the first side edge of the sub molding layer 116 in the first direction. Accordingly, the first main semiconductor chips 124 may be electrically connected to each other, and the first main chip stack 120 may be electrically connected to the sub semiconductor package 110. In this case, the signal redistribution pad 118BP-S that is connected to the first main signal interconnector 127S may be distinguished from the signal redistribution pad 118BP-S that is connected to the sub signal interconnector 117, described above.

In addition, particularly, referring to FIGS. 1 and 4, the first main power interconnector 127P may connect adjacent first chip pads 125 to each other in the vertical direction and may connect the first chip pad 125 of the lowermost first main semiconductor chip 124 to the first main upper surface substrate pad 102M1 of the substrate 100. Accordingly, the first main semiconductor chips 124 may be electrically connected to each other, and the first main chip stack 120 may be electrically connected to the substrate 100.

The first main interconnector 127 may be a bonding wire. However, the present embodiment is not limited thereto, and various types of electrical interconnectors may be used as the first main interconnector 127.

The second main chip stack 130 may include a plurality of second main semiconductor chips 134. The second main semiconductor chips 134 may be formed over the first main chip stack 120 and may be stacked in the vertical direction. While the present embodiment illustrates a case where the second main chip stack 130 includes four second main semiconductor chips 134, the present disclosure is not limited thereto, and the number of second main semiconductor chips 134 that are included in the second main chip stack 130 may be variously modified to one or more second main semiconductor chips 134. Also, even though the present embodiment discloses the number of second main semiconductor chips 134 that are included in the second main chip stack 130 being the same as the number of first main semiconductor chips 124 that are included in the first main chip stack 120, it is to be noted that these numbers may be different from each other in other embodiments.

Each of the second main semiconductor chips 134 may include NAND flash memory as described above. However, the present disclosure is not limited thereto, and each of the second main semiconductor chips 134 may include volatile memory, such as dynamic random access memory (DRAM) and static RAM (SRAM), or nonvolatile memory, such as resistive RAM (RRAM), phase-change RAM (PRAM), magneto-resistive RAM (MRAM) and ferroelectric RAM (FRAM). In the present embodiment, the second main semiconductor chips 134 are the same semiconductor chips as the first main semiconductor chips 124. However, in another embodiment, the second main semiconductor chips 134 may be different from the first main semiconductor chips 124.

The second main semiconductor chips 134 may be stacked with a predetermined offset in a direction toward the first side in the first direction. For example, the offset may be in a direction toward the upper side in FIG. 1 and the left side in FIGS. 3 to 5. Therefore, the second main chip stack 130 that has a step shape when viewed in its entirety may be formed. The offset stacking direction of the second main semiconductor chips 134 may be referred to as a second offset direction. The second offset direction may be opposite to the first offset direction. Based on such offset stacking, a second side edge of an upper surface of each of the remaining second main semiconductor chips 134, except the uppermost second main semiconductor chip 134 among the second main semiconductor chips 134, may be exposed without being covered by the second main semiconductor chip 134 lying immediately thereon. For example, a lower side edge of the upper surface of each of the remaining second main semiconductor chips 134 in FIG. 1 and the right side edge of the upper surface of each of the remaining second main semiconductor chips 134 in FIG. 3 may be exposed. The uppermost second main semiconductor chip 134 may be in a state in which its entire upper surface is exposed. Second chip pads 135 may be disposed on the exposed portions of the remaining second main semiconductor chips 134 except the uppermost second main semiconductor chip 134, and second chip pads 135 of the uppermost second main semiconductor chip 134 may also be disposed at the same positions as the second chip pads 135 of the remaining second main semiconductor chips 134. A plurality of second chip pads 135 may be arranged in a line in the second direction at the second side edge of the upper surface of each of the second main semiconductor chips 134. However, the present disclosure is not limited thereto, and the number and arrangement of the second chip pads 135 at the second side edge of the upper surface of each of the second main semiconductor chips 134 may be variously modified.

In the case where the second main semiconductor chips 134 are the same as the first main semiconductor chips 124, each of the second main semiconductor chip 134 may correspond to a state in which each of the first main semiconductor chip 124 is rotated by 180 degrees about one axis extending in the vertical direction.

Each of the second main semiconductor chips 134 may be attached to the second main semiconductor chip 134, lying immediately thereunder or the uppermost first main semiconductor chip 124 of the first main chip stack 120, with a second adhesive layer 132. The second adhesive layer 132 may be formed on the lower surface of each of the second main semiconductor chips 134 to have a shape that overlaps with the lower surface.

The second main chip stack 130 or the second main semiconductor chips 134 may have a planar area that is smaller than the sub semiconductor package 110 and may have a planar area that is larger than the sub semiconductor chip 114. The second main chip stack 130 may be disposed to expose at least the signal redistribution pads 118BP-S that is disposed at both side edges of the sub semiconductor package 110 in the first direction. A direct connection between the second main chip stack 130 and the sub semiconductor package 110, that is, a connection without passing through the substrate 100, may be possible when the signal redistribution pads 118BP-S are exposed.

The second main chip stack 130 may be connected to the substrate 100 and the sub semiconductor package 110 through second main interconnectors 137. In the present embodiment, the second main chip stack 130 may be electrically connected to the substrate 100 to receive power that is required for the operations of the second main chip stack 130 from the substrate 100. Also, the second main chip stack 130 may be electrically connected to the sub semiconductor package 110 to exchange signals with the sub semiconductor chip 114. An interconnector among the second main interconnectors 137, which connects the second main chip stack 130 and the substrate 100, will be referred to as a second main power interconnector 137P. Also, an interconnector among the second main interconnectors 137, which connects the second main chip stack 130 to the sub semiconductor package 110, will be referred to as a second main signal interconnector 137S.

In particular, referring to FIGS. 1 and 3, the second main signal interconnector 137S may connect the adjacent second chip pads 135 to each other in the vertical direction and may connect the second chip pad 135 of the lowermost second main semiconductor chip 134 and the signal redistribution pad 118BP-S that are disposed at the second side edge of the sub molding layer 116 in the first direction. Accordingly, the second main semiconductor chips 134 may be electrically connected to each other, and the second main chip stack 130 may be electrically connected to the sub semiconductor package 110. In this case, the signal redistribution pad 118BP-S that is connected to the second main signal interconnector 137S may be distinguished from the signal redistribution pad 118BP-S that is connected to the sub signal interconnector 117, described above.

In addition, particularly, referring to FIGS. 1 and 4, the second main power interconnector 137P may connect the adjacent second chip pads 135 to each other in the vertical direction and may connect the second chip pad 135 of the lowermost second main semiconductor chip 134 to the second main upper surface substrate pad 102M2 of the substrate 100. Accordingly, the second main semiconductor chips 134 may be electrically connected to each other, and the second main chip stack 130 may be electrically connected to the substrate 100.

The second main interconnector 137 may be a bonding wire. However, the present embodiment is not limited thereto, and various types of electrical interconnectors may be used as the second main interconnector 137.

For reference, in the planar views of FIGS. 1 and 2, the sub package interconnectors 117, the first main interconnectors 127, and the second main interconnectors 137 are illustrated by solid lines and dotted lines for convenience of description. However, it is to be noted that, such solid lines and dotted lines do not reflect the actual shapes of these interconnectors 117, 127, and 137.

The sub semiconductor package 110, the first main chip stack 120, and the second main chip stack 130 may be covered by a molding layer 150 that is formed over the substrate 100. The molding layer 150 may include various molding materials, such as an EMC.

The external connection terminals 140, described above, may include solder balls. However, the present disclosure is not limited thereto, and various conductive terminals such as bumps may be used as the external connection terminals 140.

In the semiconductor package described above, the first main chip stack 120 may be recognized as a single semiconductor chip while being connected with the substrate 100 and the sub semiconductor package 110 through the first main interconnectors 127. Also, the second main chip stack 130 may be recognized as another single semiconductor chip that is different from the first main chip stack 120 while being connected with the substrate 100 and the sub semiconductor package 110 through the second main interconnectors 137. The sub semiconductor chip 114 may be connected to the substrate 100 through the redistribution structure 118, the sub signal interconnector 117, and the sub power interconnector 119.

Specifically, the first main chip stack 120 may be connected to the sub semiconductor chip 114 through the first main signal interconnector 127S, the signal redistribution pad 118BP-S, and the signal redistribution conductive layer 118B-S, and thus, a signal exchange between the first main chip stack 120 and the sub semiconductor chip 114 may be possible. The second main chip stack 130 may be connected to the sub semiconductor chip 114 through the second main signal interconnector 137S, the signal redistribution pad 118BP-S, and the signal redistribution conductive layer 118B-S, and thus, a signal exchange between the second main chip stack 130 and the sub semiconductor chip 114 may be possible. The sub semiconductor chip 114 may be connected to the substrate 100 through the signal redistribution conductive layer 118B-S, the signal redistribution pad 118BP-S, and the sub signal interconnector 117, and thus, a signal exchange between the sub semiconductor chip 114 and the substrate 100 may be possible. The signal between the first main chip stack 120 and the sub semiconductor chip 114 and/or the signal between the second main chip stack 130 and the sub semiconductor chip 114 may be an internal signal transmitted inside the semiconductor package. On the other hand, the signal between the sub semiconductor chip 114 and the substrate 100 may be an outer signal that is transmitted outside the semiconductor package.

In addition, the first main chip stack 120 may be connected to the substrate 100 through the first main power interconnector 127P, and thus, may receive various levels of power, such as a ground voltage and a power voltage, from the substrate 100. The second main chip stack 130 may be connected to the substrate 100 through the second main power interconnector 137P, and thus, may receive various levels of power, such as a ground voltage and a power voltage, from the substrate 100. The sub semiconductor chip 114 may be connected to the substrate 100 through the power redistribution conductive layer 118B-P and the sub power interconnector 119, and thus, may receive various levels of power, such a ground voltage and a power voltage, from the substrate 100.

Based on the semiconductor package described above, the following advantages may be obtained.

First, as the sub chip pads 115 are disposed along the entire edges of the sub semiconductor chip 114, a relatively large number of sub chip pads 115 may be disposed as compared to the size of the sub semiconductor chip 114. In addition, by redistributing the sub chip pads 115 by using fan-out technology, the disposition of the sub chip pads 115 may be relatively free. For example, if bonding wires are directly connected to the sub chip pads 115, the disposition of the sub chip pads 115 may be restricted due to physical limitations such as the size and movement radius of the wire capillaries. On the other hand, as in the present embodiment, if the sub chip pads 115 are redistributed through the fan-out technology, the design might not be affected by such limitations.

Furthermore, because some of the sub chip pads 115 are redistributed to the signal redistribution pads 118BP-S by using fan-out technology, and the signal redistribution pads 118BP-S may be directly connected to the first and second main signal interconnectors 127S and 137S, direct signal exchange between the sub semiconductor chip 114 and the first and second main chip stacks 120 and 130 may be possible.

Furthermore, because the sub semiconductor package 110 that is larger than the first and second main chip stacks 120 and 130 is disposed under the first and second main chip stacks 120 and 130 by using fan-out technology, the first and second main chip stacks 120 and 130 may be stably formed. In a structure in which the first and second main chip stacks 120 and 130 are formed over the sub semiconductor chip 114, if the sub semiconductor chip 114 is smaller than the first and second main semiconductor chips 124 and 134, a problem may arise due to the first and second main chip stacks 120 and 130 being inclined. By substantially increasing the area of the sub semiconductor chip 114 through fan-out technology, such a problem might not occur.

Furthermore, by adjusting the shapes and/or arrangements of the signal redistribution conductive layers 118B-S, connecting the sub chip pads 115 and the signal redistribution pads 118BP-S to cause the signal redistribution conductive layers 118B-S to have similar lengths, the operation characteristics of the semiconductor package may be secured. For example, when a first channel that is connected from the first main chip stack 120 to the substrate 100 and a second channel that is connected from the second main chip stack 130 to the substrate 100 exist, a path of the first channel and a path of the second channel may have similar lengths. Therefore, it may be possible to maximally prevent the transfer rates of signals, for example, data, from becoming different from channel to channel.

Furthermore, because the length of the power redistribution conductive layer 118B-P is shorter than the length of the signal redistribution conductive layer 118B-S and the sub power interconnector 119 that extends in the vertical direction from the power redistribution conductive layer 118B-P connects the power redistribution conductive layer 118B-P and the substrate 100, it may be possible to easily supply power to the sub semiconductor chip 114. In this case, the length of the power supply path from the substrate 100 to the sub semiconductor chip 114 may be shortened, and thus, the impedance of the power supply path may decrease. This will be further described with reference to FIGS. 7A and 7B.

Figure 7A:
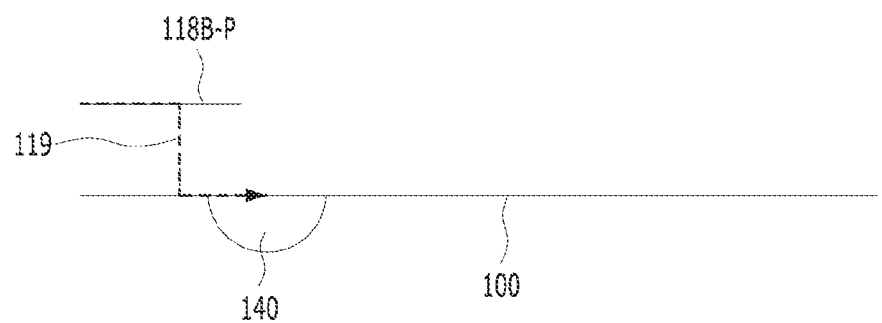
FIG. 7A is a view for explaining an example of an effect of a semiconductor package according to an embodiment of the present disclosure.
Figure 7B:
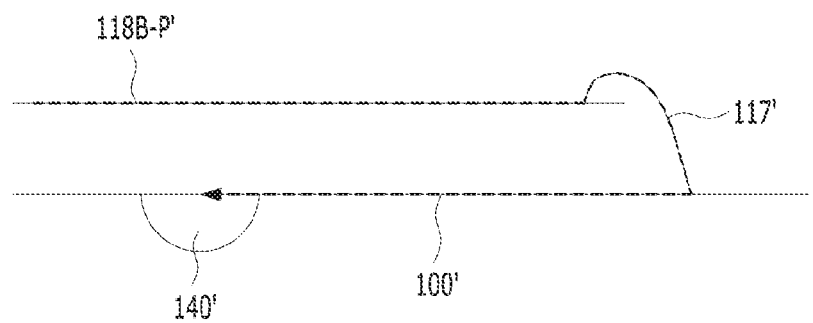
FIG. 7B is a view for explaining an effect of a semiconductor package according to a comparative example.

FIG. 7A is a view for explaining an example of an effect of a semiconductor package according to an embodiment of the present disclosure, and FIG. 7B is a view for explaining an effect of a semiconductor package according to a comparative example. FIG. 7B illustrates a case in which a power redistribution conductive layer extends to an edge of a sub molding layer similar to a signal redistribution conductive layer, and is connected to a substrate through a bonding wire, unlike the present embodiment.

Referring to FIG. 7A, a relatively short current path (see dotted arrow), passing through the power redistribution conductive layer 118B-P that has a short length, the sub power interconnector 119 connected to a point of the power redistribution conductive layer 118B-P, and the substrate 100, may be formed.

On the other hand, referring to FIG. 7B, a relatively long current path (see dotted arrow), passing through a power redistribution conductive layer 118B-P' that has a long length, a bonding wire 117' connected to an end portion of the power redistribution conductive layer 118B-P', and a substrate 100', may be formed.

As a result, according to the present embodiment as shown in FIG. 7A, a short current path may be formed, and thus, the impedance of the power supply path may be reduced. Therefore, supplying power may be facilitated.

Meanwhile, in the above-described embodiment, a case in which one power redistribution conductive layer 118B-P is connected to one sub power interconnector 119 has been described. However, the present disclosure is not limited thereto, and one power redistribution conductive layer 118B-P may be connected to two or more sub power interconnectors simultaneously. This will be further described with reference to FIGS. 8 and 9.

Figure 8:
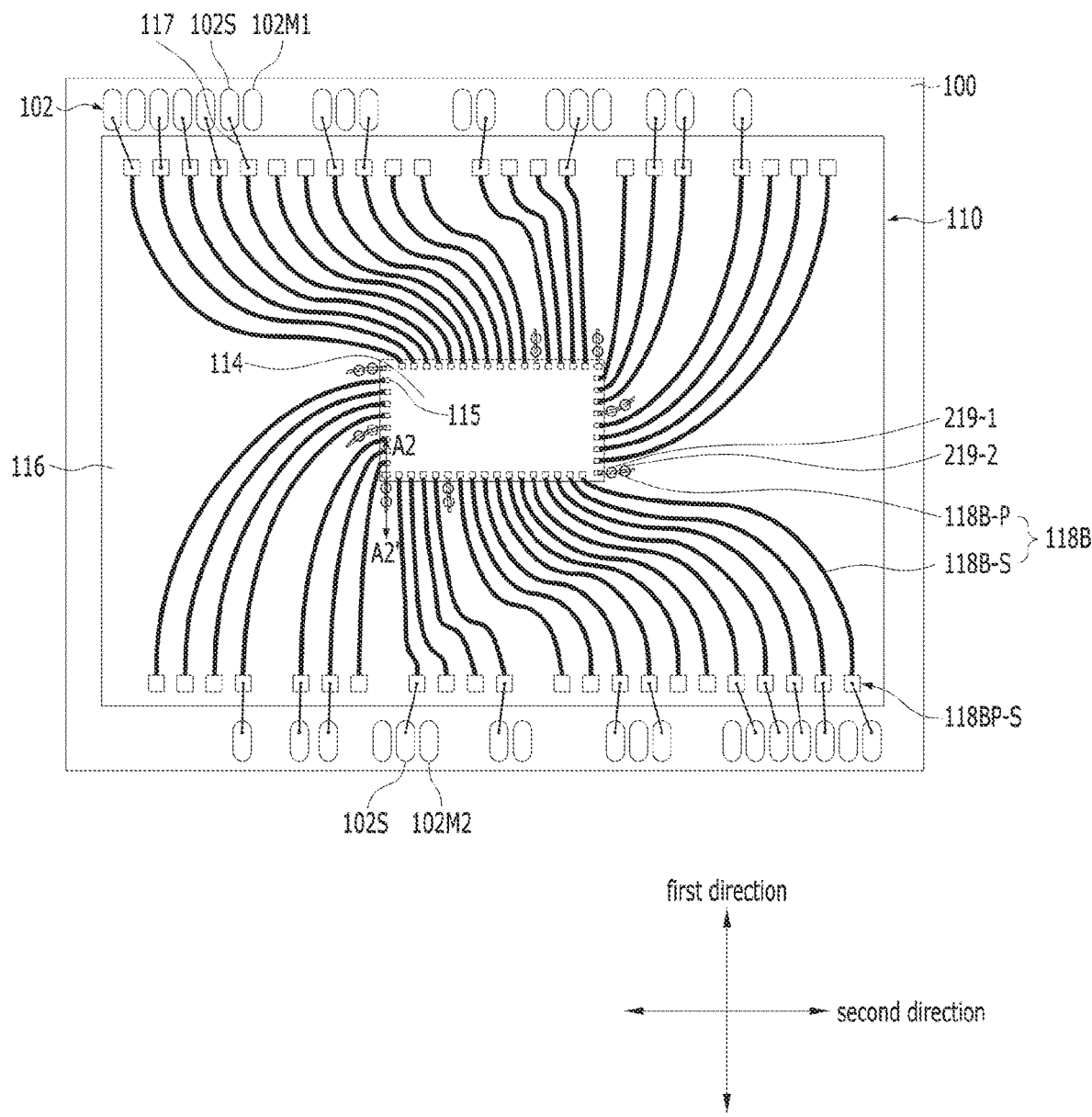
FIG. 8 is a planar view, illustrating a part of a semiconductor package, according to another embodiment of the present disclosure.
Figure 9:
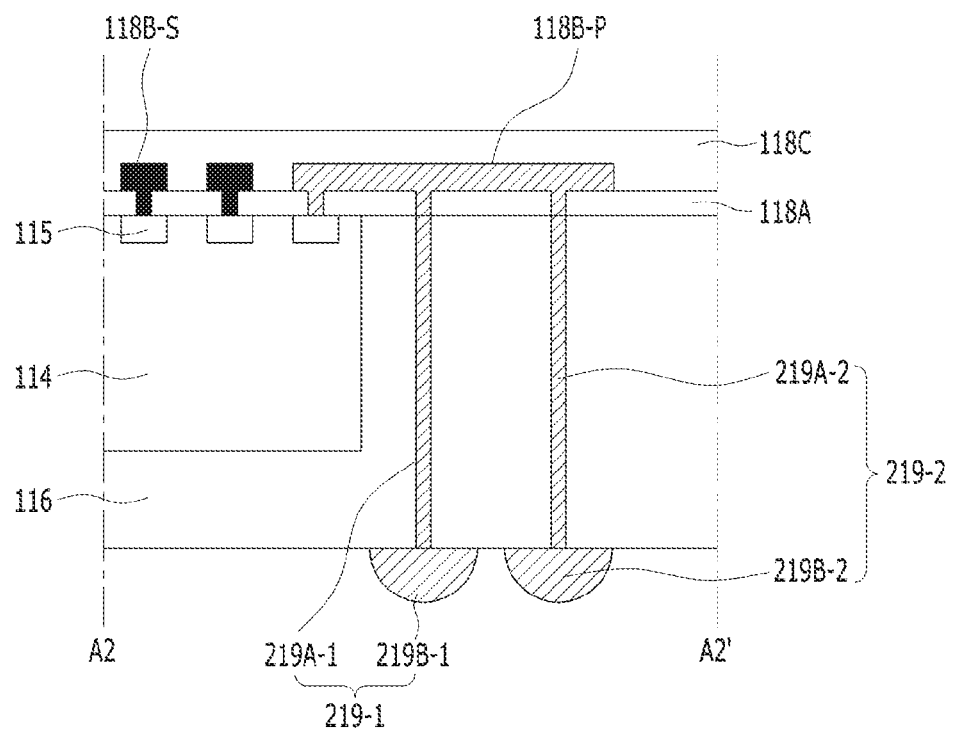
FIG. 9 is a cross-sectional view that is taken along a line A2-A2' of FIG. 8.

FIG. 8 is a planar view, illustrating a part of a semiconductor package, according to another embodiment of the present disclosure, and FIG. 9 is a cross-sectional view that is taken along a line A2-A2' of FIG. 8. Parts that are substantially the same as those of the above-described embodiment are denoted by the same reference numerals, and detailed descriptions thereof will be omitted.

Referring to FIGS. 8 and 9, one power redistribution conductive layer 118B-P may overlap and connect with two sub power interconnectors 219-1 and 219-2 at the same time.

One of the two sub power interconnectors 219-1 and 219-2, which is relatively close to the sub semiconductor chip 114, will be referred to as a first sub power interconnector 219-1, and the other of the two sub power interconnectors 219-1 and 219-2, which is relatively far from the sub semiconductor chip 114, will be referred to as a second sub power interconnector 219-2. The first sub power interconnector 219-1 and the second sub power interconnector 219-2 may be arranged to be spaced apart from each other at a predetermined interval. The first sub power interconnector 219-1 and the second sub-power interconnector 219-2 may be arranged, in series, along one power redistribution conductive layer 118B-P.

The first sub power interconnector 219-1 may include a penetrating electrode 219A-1 and a connection electrode 219B-1. Likewise, the second sub power interconnector 219-2 may include a penetrating electrode 219A-2 and a connection electrode 219B-2.

By the present embodiment, from one power redistribution conductive layer 118B-P, a current path that passes through the first sub power interconnector 219-1 and another current path that passes through the second sub power interconnector 219-2 may be formed. That is, multiple current paths may be formed. Accordingly, the inductance of the power supply path may be reduced, and thus, supplying power between the sub semiconductor package 110 and the substrate 100 may be more facilitated.

In the present embodiment, two sub power interconnectors 219-1 and 219-2 are illustrated, but the present disclosure is not limited thereto. Three or more sub power interconnectors may overlap and connect with one power redistribution conductive layer 118B-P at the same time.

Meanwhile, in the above-described embodiments, a case where the power redistribution conductive layer 118B-P is shorter than the signal redistribution conductive layer 118B-S has been described. However, the present disclosure is not limited thereto, and a power redistribution conductive layer may have the same length or a similar length as a signal redistribution conductive layer. In this case, by using a sub power interconnector that is connected to a point of the power redistribution conductive layer, a power supply path to a sub semiconductor chip may be shortened. This will be exemplarily described with reference to FIGS. 10 to 12.

Figure 10:
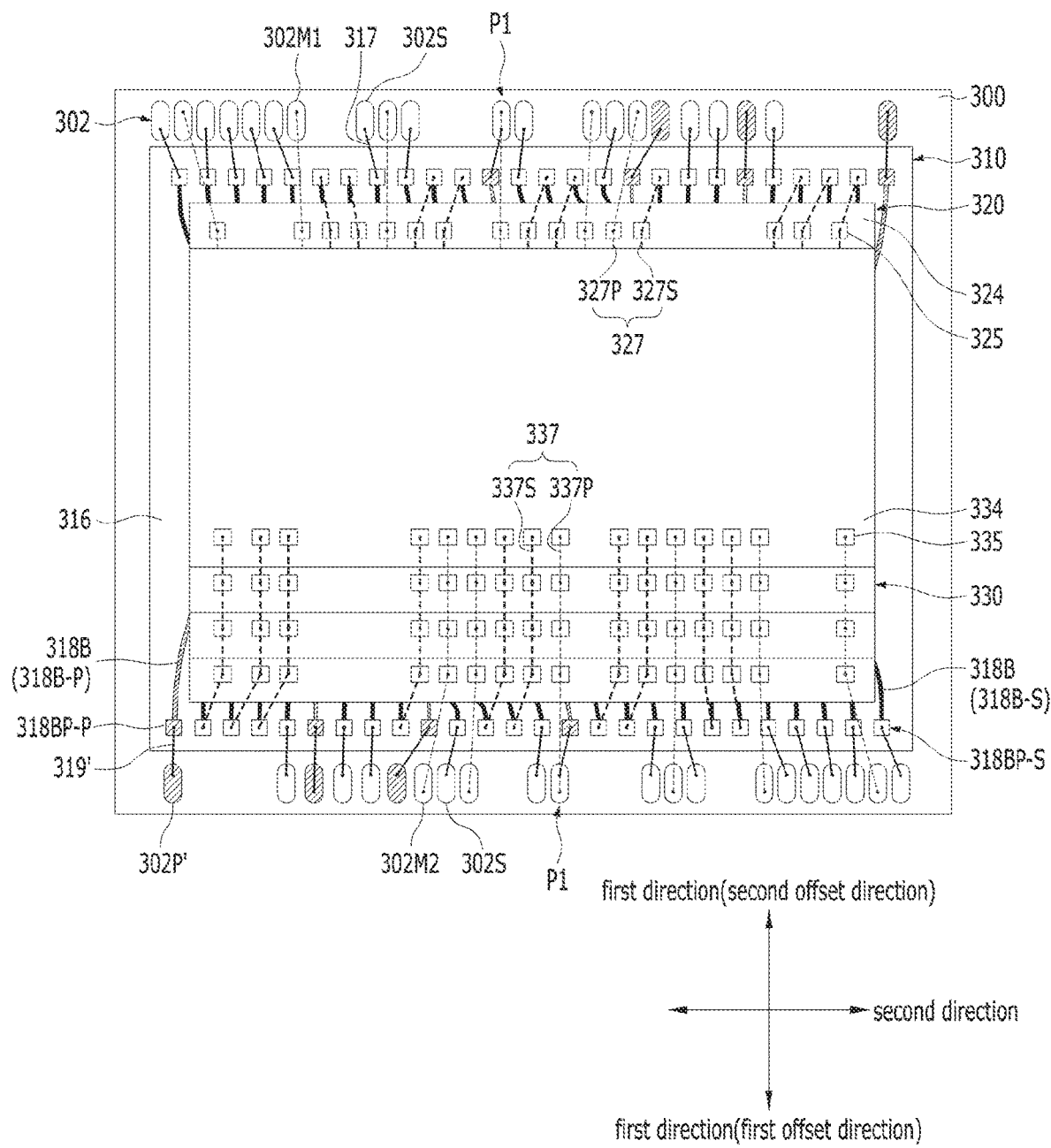
FIG. 10 is a planar view, illustrating a semiconductor package, according to another embodiment of the present disclosure.
Figure 11:
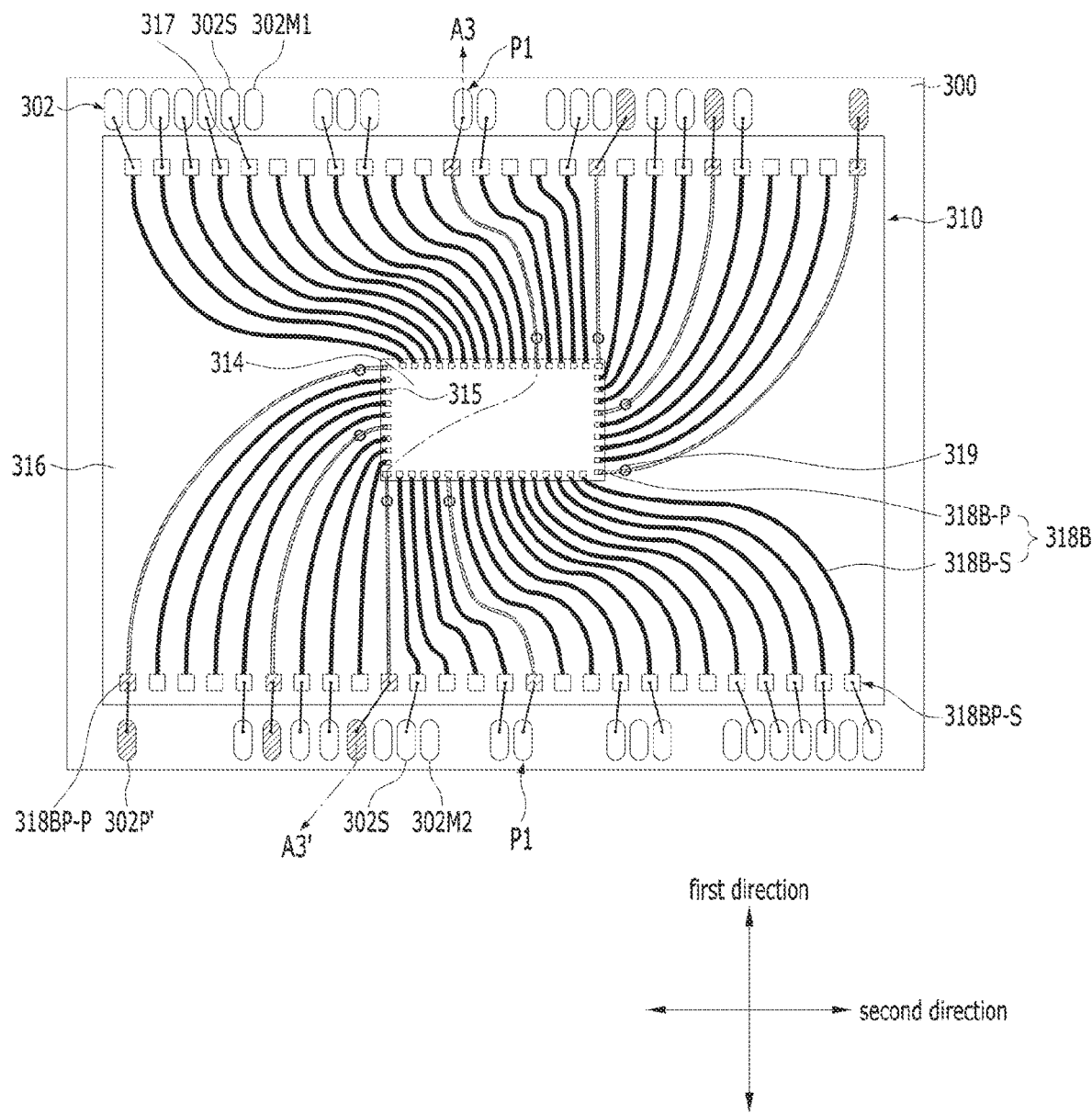
FIG. 11 is a planar view, illustrating a part of the semiconductor package, illustrated in FIG. 10, with a first main chip stack, a second main chip stack, and interconnectors that are connected with the first and second main chip stacks omitted.
Figure 12:
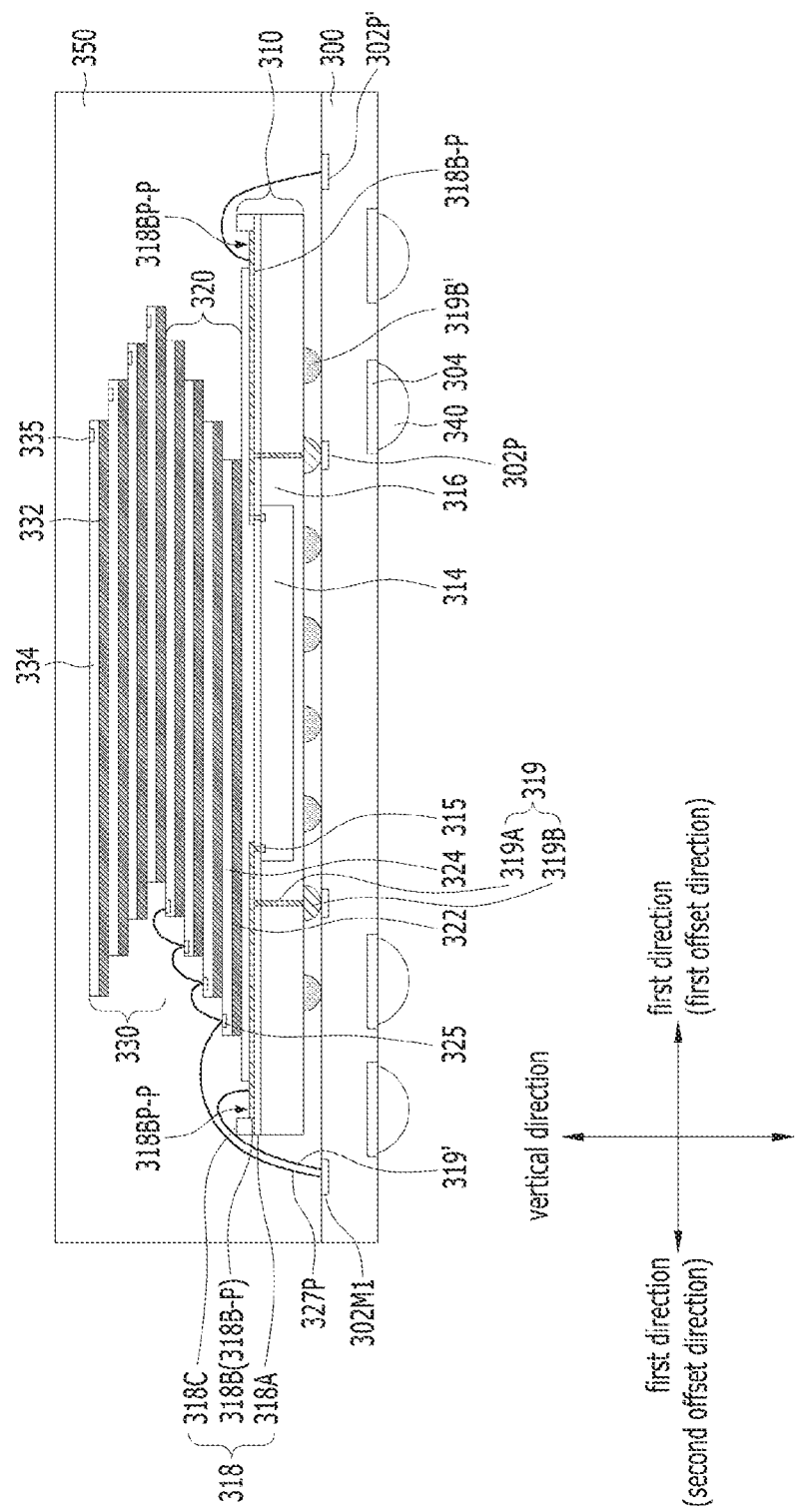
FIG. 12 is a cross-sectional view, illustrating the semiconductor package of FIG. 10.

FIG. 10 is a planar view, illustrating a semiconductor package, according to another embodiment of the present disclosure. FIG. 11 is a planar view, illustrating a part of the semiconductor package, illustrated in FIG. 10, with a first main chip stack, a second main chip stack, and interconnectors that are connected with the first and second main chip stacks omitted. FIG. 12 is a cross-sectional view, illustrating the semiconductor package of FIG. 10. FIG. 12 is shown based on a line A3-A3' of FIG. 11. In particular, a left part of FIG. 12 shows a case in which an additional sub power interconnector 319' is connected to a first main upper surface substrate pad 302M1 together with a first main power interconnector 327P. A right part of FIG. 12 shows a case in which the additional sub power interconnector 319' is connected to an additional sub power upper surface substrate pad 302P'. Detailed descriptions of parts that are substantially the same as those of the above-described embodiments will be omitted.

Referring to FIGS. 10 to 12, the semiconductor package may include a substrate 300, a sub semiconductor package 310 disposed over the substrate 300, and a first main chip stack 320 and a second main chip stack 330 that are disposed over the sub semiconductor package 310.

The substrate 300 may include upper surface substrate pads 302 and lower surface substrate pads 304. Here, the upper surface substrate pads 302 may include a sub signal upper surface substrate pad 302S, a sub power upper surface substrate pad 302P, a first main upper surface substrate pad 302M1, and a second main upper surface substrate pad 302M2. The arrangement of the sub signal upper surface substrate pad 302S, the sub power upper surface substrate pad 302P, the first main upper surface substrate pad 302M1, and the second main upper surface substrate pad 302M2 may be the same as in the above-described embodiment. Furthermore, in the present embodiment, the upper surface substrate pads 302 may further include an additional sub power upper surface substrate pad 302P'. The additional sub power upper surface substrate pad 302P' may be disposed on both edges of the substrate 300 in a first direction. The additional sub power upper surface substrate pad 302P' may be connected to a power redistribution conductive layer 318B-P, which will be described later, through wire bonding. For convenience of description, in FIGS. 10 and 11, the additional sub power upper surface substrate pad 302P' is hatched by oblique lines, unlike other upper surface substrate pads 302. The lower surface substrate pads 304 may be for connection with the external connection terminals 340.

The sub semiconductor package 310 may include a sub semiconductor chip 314, a sub molding layer 316 that surrounds the side and lower surfaces of the sub semiconductor chip 314, and a redistribution structure 318 that is formed over the upper surface of the sub semiconductor chip 314 and the sub molding layer 316.

The redistribution structure 318 may extend over the upper surface of the sub molding layer 316 while electrically connecting to sub chip pads 315 of the sub semiconductor chip 314. The redistribution structure 318 may include a first redistribution insulating layer 318A, redistribution conductive layers 318B, and a second redistribution insulating layer 318C.

The redistribution conductive layers 318B may include a signal redistribution conductive layer 318B-S and a power redistribution conductive layer 318B-P. In the present embodiment, all of the redistribution conductive layers 318B may extend towards both edges of the sub molding layer 316 in the first direction, regardless of the signal redistribution conductive layer 318B-S and the power redistribution conductive layer 318B-P. As an example, the signal redistribution conductive layer 318B-S and the power redistribution conductive layer 318B-P, which are connected to the sub chip pads 315 that are disposed at first and third side edges of the sub semiconductor chip 314 in the first and second directions, respectively, may extend toward a first side edge of the sub molding layer 316 in the first direction. In addition, the signal redistribution conductive layer 318B-S and the power redistribution conductive layer 318B-P, which are connected to the sub chip pads 315 that are disposed at second and fourth side edges of the sub semiconductor chip 314 in the first and second directions, respectively, may extend toward a second side edge of the sub molding layer 316 in the first direction. As a result, the redistribution conductive layers 318B may have a spiral shape centering around the sub semiconductor chip 314. Through this connection method, variations in the lengths of the redistribution conductive layers 318B may be reduced.

Based on the arrangement of the signal redistribution conductive layer 318B-S and the power redistribution conductive layer 318B-P, as above, the end portions of the signal redistribution conductive layer 318B-S and the power redistribution conductive layer 318B-P may be arranged along the second direction at each of the side edges of the sub molding layer 316 in the first direction. The end portion of the signal redistribution conductive layer 318B-S that is exposed by an opening of the second redistribution insulating layer 318C will be referred to as a signal redistribution pad 318BP-S. In addition, the end portion of the power redistribution conductive layer 318B-P that is exposed by an opening of the second redistribution insulating layer 318C will hereinafter be referred to as a power redistribution pad 318BP-P. As a result, the signal redistribution pad 318BP-S and the power redistribution pad 318BP-P may be disposed at both side edges of the sub molding layer 316 in the first direction. Furthermore, the signal redistribution pad 318BP-S and the power redistribution pad 318BP-P may be arranged along the second direction at each of the side edges of the sub molding layer 316 in the first direction. For convenience of description, the power redistribution conductive layer 318B-P and the power redistribution pad 318BP-P are hatched by oblique lines, unlike the signal redistribution pad 318BP-S.

The signal redistribution pad 318BP-S may be electrically connected to the substrate 300, the first main chip stack 320, or the second main chip stack 330. In particular, the signal redistribution pad 318BP-S that is electrically connected to the substrate 300 may be electrically connected to the sub signal upper surface substrate pad 302S through a sub signal interconnector 317.

The power redistribution conductive layer 318B-P may be electrically connected to the substrate 300.

First, the power redistribution conductive layer 318B-P may be electrically connected to the sub power upper surface substrate pad 302P of the substrate 300 through a sub power interconnector 319 that is disposed below it. In a planar view, the sub power interconnector 319 may overlap and connect with the power redistribution conductive layer 318B-P at a predetermined point between the sub semiconductor chip 314 and the power redistribution pad 318BP-P. This predetermined point may be closer to the sub semiconductor chip 314 as opposed to the power redistribution pad 318BP-P. This is to shorten the power supply path between the substrate 300 and the sub semiconductor chip 314. The sub power interconnector 319 may include a penetrating electrode 319A that penetrates the sub molding layer 316 and a connection electrode 319B between the sub molding layer 316 and the substrate 300. Reference numeral 319B', which is not described, may denote a dummy connection electrode.

Further, the power redistribution conductive layer 318B-P may be electrically connected to the substrate 300 by an additional sub power interconnector 319' that is connected to the power redistribution pad 318BP-P. In this case, the additional sub power interconnector 319' may be electrically connected to the additional sub power upper surface substrate pad 302P' of the substrate 300. Alternatively, the additional sub power interconnector 319' may be connected to the first main upper surface substrate pad 302M1 and/or the second main upper surface substrate pad 302M2, together with the first main power interconnector 327P and/or the second main power interconnector 337P, instead of connecting to the additional sub power upper surface substrate pad 302P' (refer to a P1 part of FIGS. 10 and 11, and a left part of FIG. 12). When the first main upper surface substrate pad 302M1 and/or the second main upper surface substrate pad 302M2 supply a specific level of power, such as a ground voltage, and this specific level of power is commonly used for the sub semiconductor chip 314, the sub semiconductor chip 314 may receive the specific level of power from the substrate 300 through the additional sub power interconnector 319' that is connected to the first main upper surface substrate pad 302M1 and/or the second main upper surface substrate pad 302M2, the power redistribution pad 318BP-P, and the power redistribution conductive layer 318B-P. The additional sub power interconnector 319' may be a bonding wire that has one end connected to the power redistribution pad 318BP-P and the other end connected to one of the additional sub power upper surface substrate pad 302P', the first main upper surface substrate pad 302M1, the second main upper surface substrate pad 302M2.

A structure of the first main chip stack 320, and connection relationships between the substrate 300 and the first main chip stack 320 and between the sub semiconductor package 310 and the first main chip stack 320 may be substantially the same as in the above-described embodiment. In addition, a structure of the second main chip stack 330, and connection relationships between the substrate 300 and the second main chip stack 330 and between the sub semiconductor package 310 and the second main chip stack 330 may be substantially the same as in the above-described embodiment. Reference numerals 324, 322, 325, 327, and 327S, which are not described, may denote a first main semiconductor chip, a first adhesive layer, a first chip pad, a first main interconnector, and a first main signal interconnector, respectively. Further, reference numerals 334, 332, 335, 337, and 337S, which are not described, may denote a second main semiconductor chip, a second adhesive layer, a second chip pad, a second main interconnector, and a second main signal interconnector, respectively.

The sub semiconductor package 310, the first main chip stack 320, and the second main chip stack 330 may be covered by a molding layer 350 that is formed over the substrate 300.

According to the present embodiment, it may be possible to form a first current path from one power redistribution conductive layer 318B-P through the sub power interconnector 319 and a second current path from the one power redistribution conductive layer 318B-P through the additional sub power interconnector 319'. That is, multiple current paths as well as a short current path may be formed. As a result, the impedance and the inductance of the power supply path may be reduced, and thus, supplying power between the sub semiconductor package 310 and the substrate 300 may be facilitated.

According to the above embodiments of the present disclosure, it may be possible to implement a high-volume and multifunctional semiconductor package by forming a main chip stack with one or more main semiconductor chips over a sub semiconductor package, and to facilitate to supply power to the sub semiconductor package.

Figure 13:
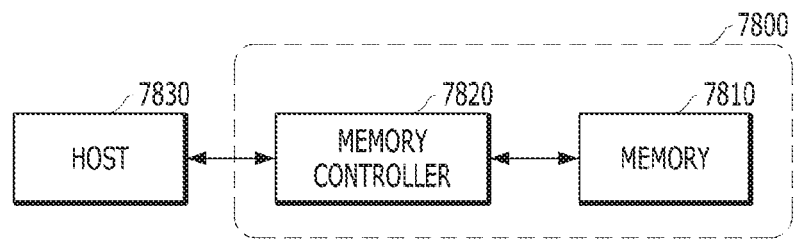
FIG. 13 shows a block diagram illustrating an electronic system employing a memory card including a semiconductor package, according to an embodiment.

FIG. 13 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 14:
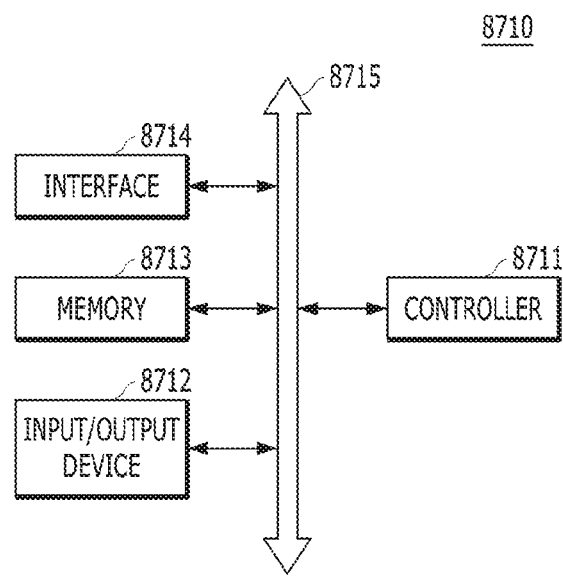
FIG. 14 shows a block diagram illustrating another electronic system including a semiconductor package, according to an embodiment.

FIG. 14 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:

1. A semiconductor package, comprising:
   a substrate;

a sub semiconductor package disposed over the substrate, wherein the sub semiconductor package includes a sub semiconductor chip with chip pads on its upper surface, a sub molding layer that surrounds side surfaces of the sub semiconductor chip, and a redistribution conductive layer that is connected to each of the chip pads and extends over an upper surface of the sub molding layer, wherein the redistribution conductive layer includes a signal redistribution conductive layer that extends onto an edge of the sub molding layer with a signal redistribution pad on its end portion and includes a power redistribution conductive layer with a length that is shorter than a length of the signal redistribution conductive layer;

a sub signal interconnector connecting the signal redistribution pad to the substrate;

a sub power interconnector extending in a vertical direction under the power redistribution conductive layer to connect the power redistribution conductive layer to the substrate; and at least one main semiconductor chip formed over the sub semiconductor package and electrically connected to the substrate or the sub semiconductor chip.

2. The semiconductor package according to claim 1, wherein the sub power interconnector includes:
   a penetrating electrode with an upper surface that is connected to the power redistribution conductive layer, the penetrating electrode penetrating the sub molding layer; and
   a connection electrode disposed between the sub molding layer and the substrate, the connection electrode with an upper surface that is connected to the penetrating electrode and a lower surface that is connected to the substrate.

3. The semiconductor package according to claim 2, further comprising:
   a dummy connection electrode disposed between the sub molding layer and the substrate without being connected to the penetrating electrode.

4. The semiconductor package according to claim 1, wherein the sub signal interconnector includes a bonding wire.

5. The semiconductor package according to claim 1, wherein a power supply path that passes through the power redistribution conductive layer, the sub power interconnector, and the substrate is formed.

6. The semiconductor package according to claim 1, wherein one power redistribution conductive layer is connected to two or more sub power interconnectors, wherein the two or more sub power interconnectors are spaced apart from each other.

7. The semiconductor package according to claim 1, wherein the chip pads are disposed along first and second side edges of the sub semiconductor chip in a first direction and disposed along third and fourth side edges of the sub semiconductor chip in a second direction, the second direction being perpendicular to the first direction,
   wherein the signal redistribution pad includes a plurality of signal redistribution pads that are disposed at first and second side edges of the sub molding layer in the first direction,
   wherein the signal redistribution conductive layer includes a plurality of signal redistribution conductive layers,
   wherein some of the signal redistribution conductive layers, which are connected to the chip pads that are disposed at the first and third side edges of the sub semiconductor chip in the first and second directions, extend toward the signal redistribution pads that are disposed at the first side edge of the sub molding layer in the first direction, and
   wherein a rest of the signal redistribution conductive layers, which are connected to the chip pads that are disposed at the second and fourth side edges of the sub semiconductor chip in the first and second directions, extend toward the signal redistribution pads that are disposed at the second side edge of the sub molding layer in the first direction.

8. The semiconductor package according to claim 7, wherein the signal redistribution conductive layers form a spiral shape, centering around the sub semiconductor chip.

9. The semiconductor package according to claim 7, wherein the substrate includes substrate pads that are disposed at a first side edge and a second side edge of the substrate in the first direction,
   wherein the sub signal interconnector includes a plurality of sub signal interconnectors, and
   wherein the sub signal interconnectors connect the signal redistribution pads that are disposed at the first side edge of the sub molding layer in the first direction, to the substrate pads that are disposed at the first side edge of the substrate in the first direction, and connect the signal redistribution pads that are disposed at the second side edge of the sub molding layer in the first direction, to the substrate pads that are disposed at the second side edge of the substrate in the first direction.

10. The semiconductor package according to claim 7, wherein the at least one main semiconductor chip includes:
    at least one first main semiconductor chip connected to the signal redistribution pads that are disposed at the first side edge of the sub molding layer in the first direction through first main interconnectors; and
    at least one second main semiconductor chip connected to the signal redistribution pads that are disposed at the second side edge of the sub molding layer in the first direction through second main interconnectors.

11. The semiconductor package according to claim 10, wherein the signal redistribution pads are not covered by the first and second main semiconductor chips.

12. The semiconductor package according to claim 1, wherein the at least one main semiconductor chip includes memory, and the sub semiconductor chip includes a memory controller.

13. The semiconductor package according to claim 1, wherein the substrate includes substrate pads that are disposed at a first side edge and a second side edge of the substrate in a first direction, and
    wherein the at least one main semiconductor chip includes:
    at least one first main semiconductor chip connected to the substrate pads that are disposed at the first side edge of the substrate through first main interconnectors; and
    at least one second main semiconductor chip connected to the substrate pads that are disposed at the second side edge of the substrate through second main interconnectors.

14. The semiconductor package according to claim 13, wherein the at least one first main semiconductor chip comprises a plurality of first main semiconductor chips that are offset-stacked from the first side edge of the substrate toward the second side edge of the substrate in the first direction, and wherein the at least one second main semiconductor chip comprises a plurality of second main semiconductor chips that are offset-stacked from the second side edge of the substrate toward the first side edge of the substrate in the first direction.

* * * * *